(12) United States Patent
Zhou et al.

(10) Patent No.: US 10,249,654 B1
(45) Date of Patent: Apr. 2, 2019

(54) MANUFACTURING METHOD OF TOP-GATE TFT AND TOP-GATE TFT (71) Applicant: Shenzhen China Star Optoelectronics Semiconductor Display Technology Co., Ltd., Shenzhen (CN)

(72) Inventors: Zhichao Zhou, Shenzhen (CN); Hui Xia, Shenzhen (CN); Meng Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/744,066

(22) PCT Filed: Dec. 15, 2017

(86) PCT No.: PCT/CN2017/116301
§ 371 (c)(1),
(2) Date: Jan. 12, 2018

(30) Foreign Application Priority Data

Nov. 22, 2017 (CN) .......................... 201711177281.8

(51) Int. Cl.
*H01L 27/12* (2006.01)
*H01L 51/00* (2006.01)
*H01L 51/05* (2006.01)
*H01L 21/02* (2006.01)
*H01L 21/4757* (2006.01)
(Continued)

(52) U.S. Cl.
CPC .... *H01L 27/1288* (2013.01); *H01L 21/02554* (2013.01); *H01L 21/02565* (2013.01); *H01L 21/02628* (2013.01); *H01L 21/475* (2013.01);
*H01L 21/47573* (2013.01); *H01L 27/1225* (2013.01); *H01L 27/283* (2013.01); *H01L 29/22* (2013.01); *H01L 29/24* (2013.01); *H01L 29/66969* (2013.01); *H01L 29/7869* (2013.01); *H01L 51/0003* (2013.01); *H01L 51/0017* (2013.01); *H01L 51/0048* (2013.01); *H01L 51/0541* (2013.01); *H01L 51/0558* (2013.01); *H01L 29/4908* (2013.01); *H01L 51/0525* (2013.01)

(58) Field of Classification Search
CPC ................................................ H01L 27/1288
USPC ............................................................ 257/29
See application file for complete search history.

(56) References Cited

U.S. PATENT DOCUMENTS

2014/0159037 A1* 6/2014 Kwon ............... H01L 29/78618
257/43

* cited by examiner

*Primary Examiner* — Igwe U Anya
(74) *Attorney, Agent, or Firm* — Leong C. Lei (57) ABSTRACT

The invention provides a manufacturing method of top-gate TFT and top-gate TFT. The manufacturing method forms first and second insulating layers sequentially on a base substrate, and uses a first mask to form first and second vias separated with interval on the second insulating layer, forms a through groove on the first insulation layer below the first and second vias, the through groove connects the first and second vias, and forms a vertical U-shaped trench with the first and second vias, then fills the vertical U-shaped trench to form an active layer, and finally uses a second mask to form a source, a drain, and a gate on the second insulating layer. As such, the top-gate TFT structure is simplified and the number of mask processes is reduced. With two mask processes to manufacture a top-gate TFT with vertical U-shaped trench, the invention saves the manufacturing cost.

11 Claims, 8 Drawing Sheets

(51) Int. Cl.
*H01L 21/475* (2006.01)
*H01L 29/66* (2006.01)
*H01L 29/22* (2006.01)
*H01L 29/24* (2006.01)
*H01L 29/786* (2006.01)
*H01L 27/28* (2006.01)
H01L 29/49 (2006.01)

MANUFACTURING METHOD OF TOP-GATE TFT AND TOP-GATE TFT

BACKGROUND OF THE INVENTION

1. Field of the Invention

The present invention relates to the field of display techniques, and in particular to a top-gate thin film transistor (TFT) and top-gate TFT.

2. The Related Arts

The thin film transistor (TFT) is the main switch component in liquid crystal display (LCD) and active matrix organic light-emitting diode (AMOLED) display, and is directly related to the development trend of the high performance panel display device.

The TFT can be of a variety of structures. In the conventional TFT with a bottom gate structure, a large parasitic capacitance is generated due to a large overlapped area between the gate and the source/drain, which results in a delay of the signal, and a larger-size TFT, thus limiting the application. The top-gate TFT has a lower parasitic capacitance and better ductility due to no overlapping between the source/drain and the gate, thus is able to reduce the delay in signal transmission. Also, the use of self-alignment preparation method is conducive to the preparation of short-channel devices to improve device characteristics; therefore, the top-gate TFT structure has become the main trend of development.

Figure 1:
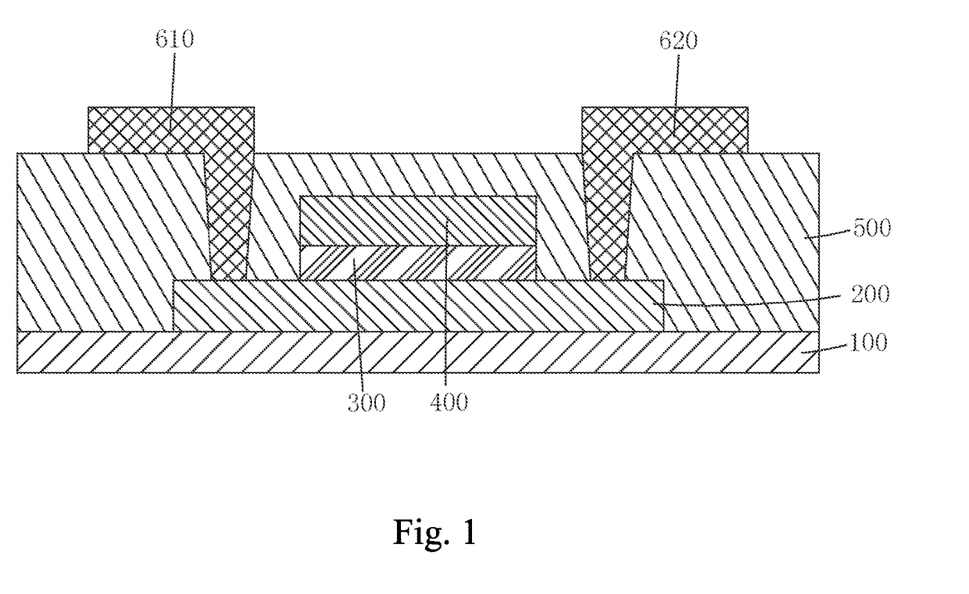
FIG. 1 is a schematic view showing the structure of a conventional top-gate TFT.

In the conventional technology, the normal production process of the top-gate TFT usually requires more photomasks. FIG. 1 shows a schematic view of the known top-gate TFT structure. As shown in FIG. 1, the top-gate TFT comprises, from the bottom to the top, an active layer 200, a gate insulating layer 300, a gate 400, an interlayer dielectric layer 500, a source 610 and a drain 620, disposed on the base substrate 100 and sequentially stacked, wherein the source 610 and the drain 620 are in contact with both ends of the active layer 200 through the vias disposed on the interlayer dielectric layer 500.

In the manufacturing method for the above top-gate TFT, the patterning of the active layer 200, the patterning of the gate 400 and the gate insulating layer 300, the patterning of the interlayer dielectric 500, the source 610 and the drain 620 must at least use a photo-mask to complete the process respectively. Therefore, the entire top-gate TFT process requires at least four masks to complete, resulting in complex process and higher production costs.

SUMMARY OF THE INVENTION

The object of the present invention is to provide a manufacturing method of top-gate TFT, which is able to reduce the number of mask processes and save manufacturing cost.

Another object of the present invention is to provide a top-gate TFT, having a simple structure and manufactured with less number of mask processes to save manufacturing cost.

To achieve the above object, the present invention provides a manufacturing method of top-gate TFT, comprising the following steps of:

Step S1: providing a base substrate, a first insulating layer and a second insulating layer being deposited on the base substrate sequentially;

Step S2: providing a first mask, using the first mask to form a first photo-resist layer on the second insulating layer, using the first photo-resist layer as a shielding layer to etch the second insulating layer to form a first via and a second via separated with interval on the second insulating layer;

Step S3: etching the first insulating layer to form a through groove under the first via and the second via, and connecting the first via and the second via, the through groove, the first via, and the second via forming a vertical U-shaped trench;

Step S4: providing a semiconductor solution, coating the semiconductor solution over the vertical U-shaped trench, curing the semiconductor solution to form an active layer filling the vertical U-shaped trench; removing the first photo-resist layer;

Step S5: providing a second mask, using the second mask to patternize to form a source, a drain and a gate separated with intervals on the second insulating layer, the gate being disposed on the second insulating layer between the first via and the second via, and the source and the drain being disposed on two sides of the gate and respectively covering and contacting the active layer inside the first via and the second via.

According to a preferred embodiment of the present invention, the second mask provided in Step S5 is a halftone grayscale mask, and Step S5 further comprises forming a sunk concave trench between the first via and the second via on the second insulating layer, and the gate is disposed inside the sunk concave trench.

According to a preferred embodiment of the present invention, Step S5 specifically comprises:

Step S51: providing the second mask, coating a photo-resist on the second insulating layer, using the second mask to perform exposure and lithography on the photo-resist to obtain a second photo-resist layer of the second insulating layer between the first via and the second via, and a first concave trench and a second concave trench disposed on the second photo-resist layer and correspondingly located above the first via and the second via;

S52: using the second photo-resist layer as shielding layer to etch the second insulating layer to form the sunk concave trench between the first via and the second via on the second insulating layer;

Step S53: performing oxygen ashing treatment on the second photo-resist layer to thin the second photo-resist layer, the first concave trench and the second concave trench exposing the first via and the second via to obtain a third photo-resist layer of the exposed first via, the second via, and the sunken concave trench, depositing a conductive metal layer on the third photo-resist layer and the second insulation layer, removing the third photo-resist layer and the conductive metal layer thereon to obtain the source, the drain, and the gate.

According to a preferred embodiment of the present invention, in Step S2, the second insulating layer is etched by a dry etching process using an etching gas;

in Step S3, the first insulating layer is etched by a wet etching process using an etching liquid.

According to a preferred embodiment of the present invention, the material of the first insulating layer is aluminum oxide, hafnium dioxide or zirconium dioxide; the material of the second insulating layer is silicon oxide or silicon nitride.

According to a preferred embodiment of the present invention, the semiconductor solution provided in Step S4 is a carbon nanotube semiconductor solution, a zinc oxide semiconductor solution, or an indium gallium zinc oxide semiconductor solution.

The present invention also provides a top-gate TFT, which comprises: a base substrate, a first insulating layer disposed on the base substrate, a second insulating layer disposed on the first insulating layer, a vertical U-shaped trench disposed on the first insulating layer and the second insulating layer, an active layer filling the vertical U-shaped trench, and a source, a drain, and a gate separated with intervals and disposed on the second insulating layer;

a first via and a second via disposed on the second insulating layer and separated with interval, the first insulating layer being disposed with a through groove under the first via and the second via, and contacting the first via and the second via, the through groove, the first via, and the second via forming the vertical U-shaped trench;

the gate being disposed between the first via and the second via on the second insulating layer, and the source and the drain being disposed on two sides of the gate and respectively covering and contacting the active layer inside the first via and the second via.

According to a preferred embodiment of the present invention, a sunk concave trench is disposed between the first via and the second via on the second insulating layer, and the gate is disposed inside the sunk concave trench.

According to a preferred embodiment of the present invention, the material of the first insulating layer is aluminum oxide, hafnium dioxide or zirconium dioxide; the material of the second insulating layer is silicon oxide or silicon nitride.

According to a preferred embodiment of the present invention, the material of the active layer is carbon nanotube semiconductor, zinc oxide semiconductor, or indium gallium zinc oxide semiconductor.

The present invention also provides a manufacturing method of top-gate TFT, comprising the following steps of:

Step S1: providing a base substrate, a first insulating layer and a second insulating layer being deposited on the base substrate sequentially;

Step S2: providing a first mask, using the first mask to form a first photo-resist layer on the second insulating layer, using the first photo-resist layer as a shielding layer to etch the second insulating layer to form a first via and a second via separated with interval on the second insulating layer;

Step S3: etching the first insulating layer to form a through groove under the first via and the second via, and connecting the first via and the second via, the through groove, the first via, and the second via forming a vertical U-shaped trench;

Step S4: providing a semiconductor solution, coating the semiconductor solution over the vertical U-shaped trench, curing the semiconductor solution to form an active layer filling the vertical U-shaped trench; removing the first photo-resist layer;

Step S5: providing a second mask, using the second mask to patternize to form a source, a drain and a gate separated with intervals on the second insulating layer, the gate being disposed on the second insulating layer between the first via and the second via, and the source and the drain being disposed on two sides of the gate and respectively covering and contacting the active layer inside the first via and the second via;

wherein the second mask provided in Step S5 being a halftone grayscale mask, and Step S5 further comprising forming a sunk concave trench between the first via and the second via on the second insulating layer, and the gate being disposed inside the sunk concave trench;

wherein Step S5 specifically comprising:

Step S51: providing the second mask, coating a photo-resist on the second insulating layer, using the second mask to perform exposure and lithography on the photo-resist to obtain a second photo-resist layer of the second insulating layer between the first via and the second via, and a first concave trench and a second concave trench disposed on the second photo-resist layer and correspondingly located above the first via and the second via;

Step S52: using the second photo-resist layer as shielding layer to etch the second insulating layer to form the sunk concave trench between the first via and the second via on the second insulating layer;

Step S53: performing oxygen ashing treatment on the second photo-resist layer to thin the second photo-resist layer, the first concave trench and the second concave trench exposing the first via and the second via to obtain a third photo-resist layer of the exposed first via, the second via, and the sunken concave trench, depositing a conductive metal layer on the third photo-resist layer and the second insulation layer, removing the third photo-resist layer and the conductive metal layer thereon to obtain the source, the drain, and the gate;

wherein in Step S2, the second insulating layer being etched by a dry etching process using an etching gas;

in Step S3, the first insulating layer being etched by a wet etching process using an etching liquid;

wherein the material of the first insulating layer being aluminum oxide, hafnium dioxide or zirconium dioxide; the material of the second insulating layer being silicon oxide or silicon nitride;

wherein the semiconductor solution provided in Step S4 being a carbon nanotube semiconductor solution, a zinc oxide semiconductor solution, or an indium gallium zinc oxide semiconductor solution.

The present invention provides the following advantages: the manufacturing method of top-gate TFT of the present invention first forms a first insulating layer and a second insulating layer sequentially on a base substrate, and uses a first mask to form a first via and a second via separated with interval on the second insulating layer, forms a through groove on the first insulation layer below the first via and the second via, the through groove connects the first and the second vias, and forms a vertical U-shaped trench with the first and second vias, then fills the vertical U-shaped trench to form an active layer, and finally uses a second mask to form a source, a drain, and a gate on the second insulating layer. As such, the top-gate TFT structure is simplified and the number of mask processes is reduced. With two mask processes to manufacture a top-gate TFT with vertical U-shaped trench, the invention saves the manufacturing cost. The top-gate TFT of the present invention comprises a base substrate, a first insulating layer, a second insulating layer, an active layer, a source, a drain, and a gate; the second insulating layer is provided with a first via and a second via separated with interval, the first insulating layer is disposed with a through groove beneath the first via and the second via, the through groove connects the first via and the second via, and forms a vertical U-shaped trench with the first via and the second via; the active layer fills the vertical U-shaped trench, the gate is disposed on the second insulating layer between the first via and the second via, the source and the drain are disposed on two sides of the gate and respectively contact the active layer inside the first via and the second via. The structure is simple, and the number of mask process to manufacture is reduced to save manufacturing cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings:

FIG. 8 is a schematic views showing the planar structure of FIG. 7, and FIG. 7 is a cross-sectional view of FIG. 8 along A-A line;

FIG. 13 shows a cross-sectional view of the top-gate TFT of the present invention;

FIG. 14 is a schematic view showing the planar structure of FIG. 13, i.e., the top-gate TFT of the present invention, and FIG. 13 is a cross-sectional view of FIG. 14 along A-A line.

DETAILED DESCRIPTION OF THE PREFERRED EMBODIMENTS

Figure 2:
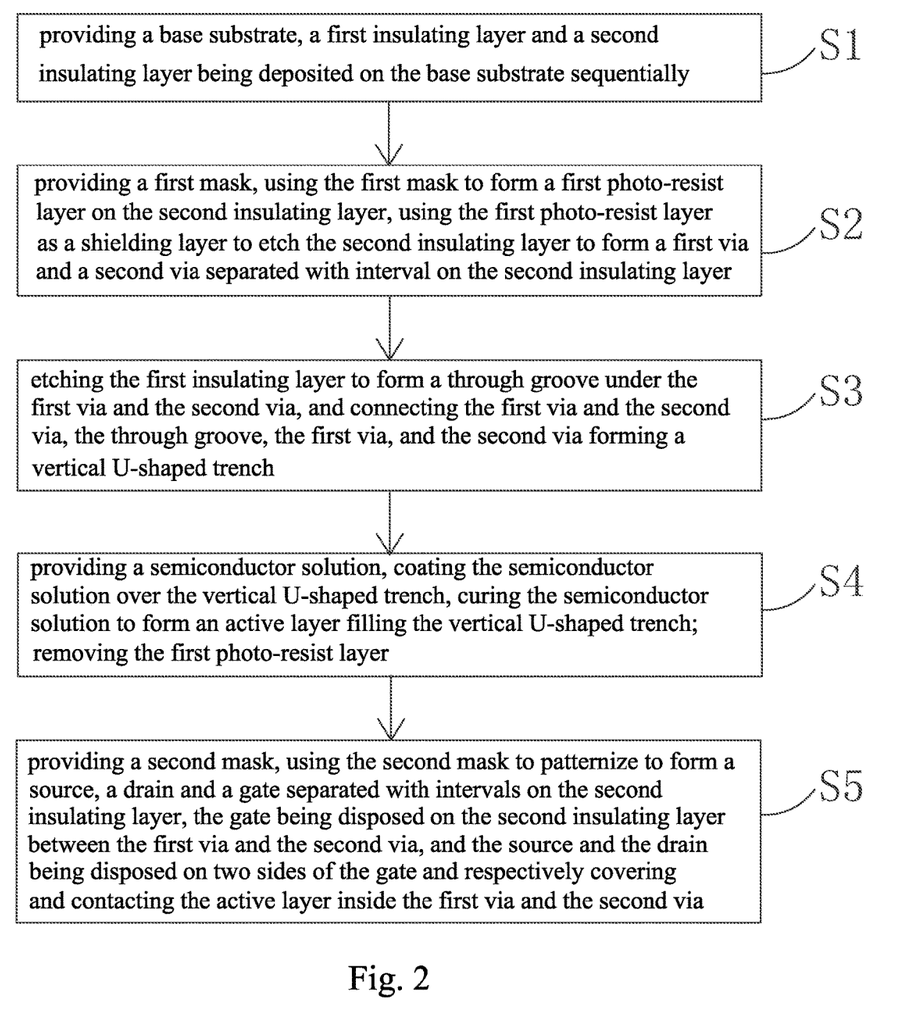
FIG. 2 is a schematic view showing the flowchart of the manufacturing method of top-gate TFT according to a preferred embodiment of the present invention.

Referring to FIG. 2, the present invention provides a manufacturing method of top-gate TFT, comprising the following steps of:

Step S1: providing a base substrate 10, a first insulating layer 20 and a second insulating layer 30 being deposited on the base substrate 10 sequentially; the deposition is performed with materials having different dielectric constants and film layer characteristics for the first insulating layer 20 and the second insulating layer 30. For example, the first insulating layer 20 at the bottom layer can be formed with aluminum oxide ($Al_2O_3$), hafnium dioxide ($HfO_2$) or zirconium dioxide ($ZrO_2$); and the material of the second insulating layer 30 can be silicon oxide ($SiO_x$) or silicon nitride ($SiN_x$).

Specifically, the first insulating layer 20 and the second insulating layer 30 are deposited by CVD process or PLD process.

Figure 3:
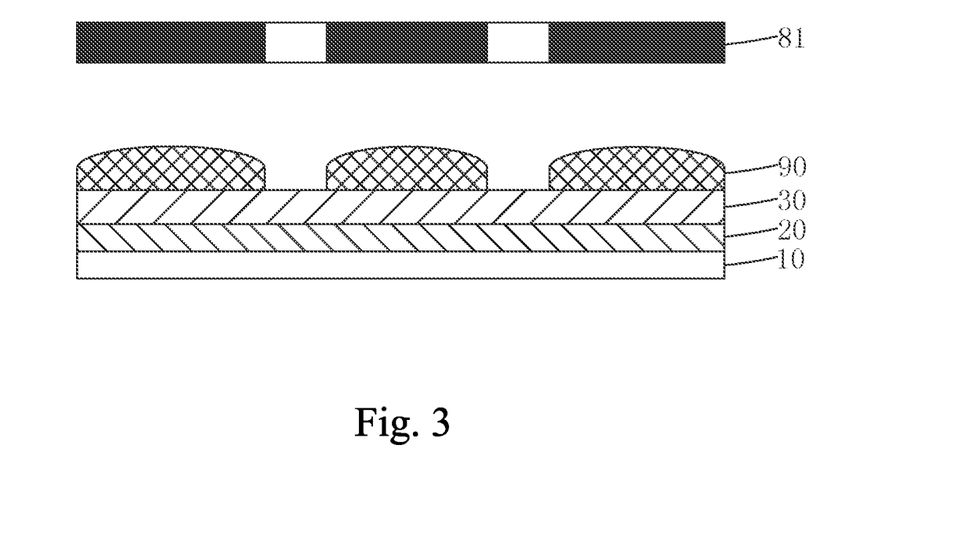
FIGS. 3-4 are schematic views showing Step S2 of the manufacturing method of top-gate TFT according to a preferred embodiment of the present invention.
Figure 4:
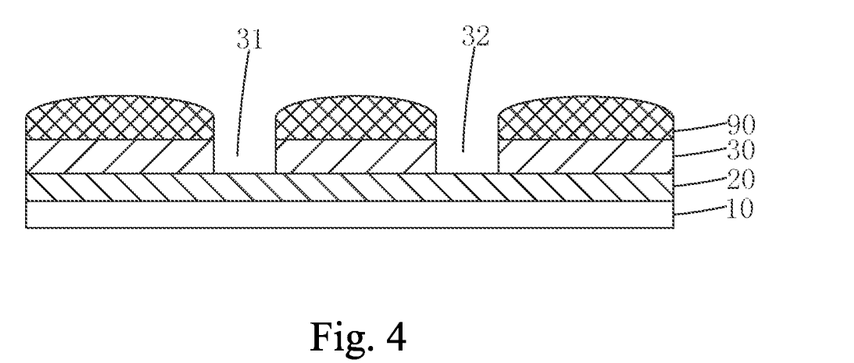

Step S: as shown in FIGS. 3-4, providing a first mask 81, coating a photo-resist layer on the second insulating layer 30, using the first mask 81 to perform exposure and lithography on the photo-resist layer to form a first photo-resist layer 90 on the second insulating layer 30, using the first photo-resist layer 90 as a shielding layer to etch the second insulating layer 30 to form a first via 31 and a second via 32 separated with interval on the second insulating layer 90.

Specifically, in Step S2, the second insulating layer 30 is etched by a dry etching process using an etching gas. The second insulating layer 30 is etched by ion bombardment of the second insulating layer 30 with the etching gas having a selective etching characteristic with respect to the material of the second insulating layer 30 as opposed to the material of the first insulating layer 20. That is, the etching gas has an etching effect only on the second insulating layer 30 and does not have an etching effect on the first insulating layer 20. Therefore, during the etching, the first insulating layer 20 is not damaged or damaged minimally; that is, when Step S2 is etched to the surface of the first insulating layer 20, the etching is stopped.

Figure 5:
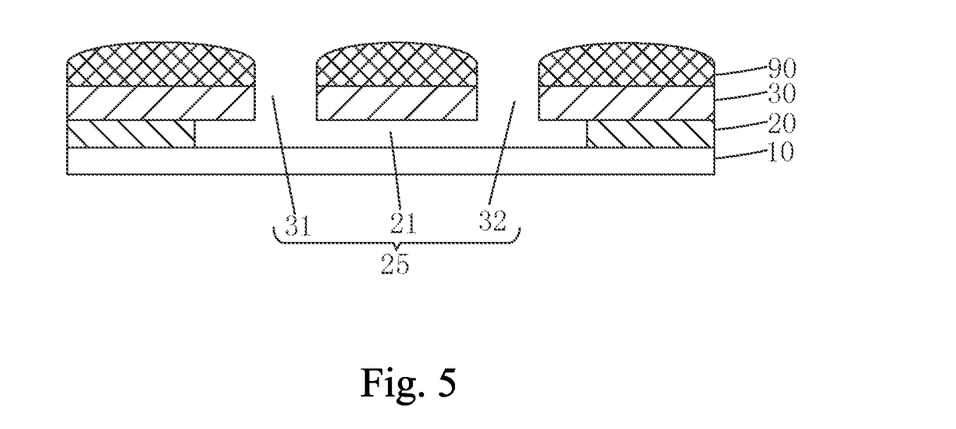
FIG. 5 is a schematic view showing Step S3 of the manufacturing method of top-gate TFT according to a preferred embodiment of the present invention.

Step S3: as shown in FIG. 5, etching the first insulating layer 20 to form a through groove 21 under the first via 31 and the second via 32, and connecting the first via 31 and the second via 32, the through groove 21, the first via 31, and the second via 32 forming a vertical U-shaped trench 25.

Specifically, in Step S3, the first insulating layer 20 is etched by a wet etching process using an etching gas. The etching liquid has a selective etching characteristic with respect to the material of the first insulating layer 20 as opposed to the material of the second insulating layer 30. That is, the etching liquid has an etching effect only on the first insulating layer 20 and does not have an etching effect on the second insulating layer 30. For example, the hydrochloric acid is used to etch the first insulating layer 20 of $Al_2O_3$. Therefore, the etchant has no effect on the second insulating layer 30 during etching.

Figure 6:
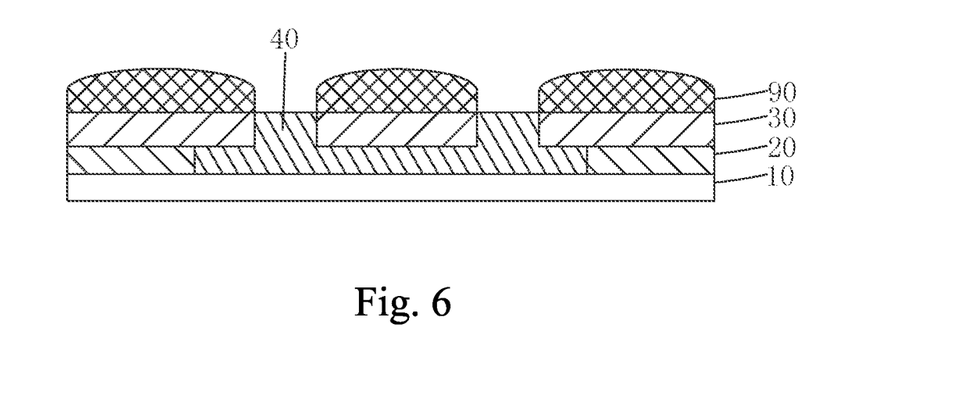
FIGS. 6-7 are schematic views showing Step S4 of the manufacturing method of top-gate TFT according to a preferred embodiment of the present invention.
Figure 7:
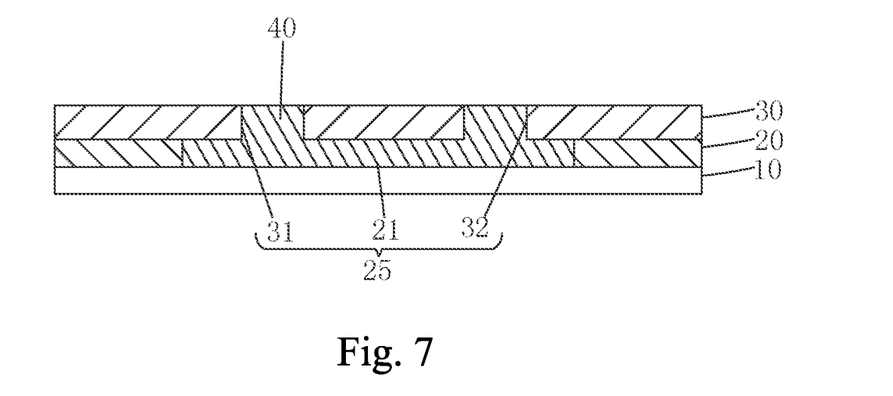
Figure 8:
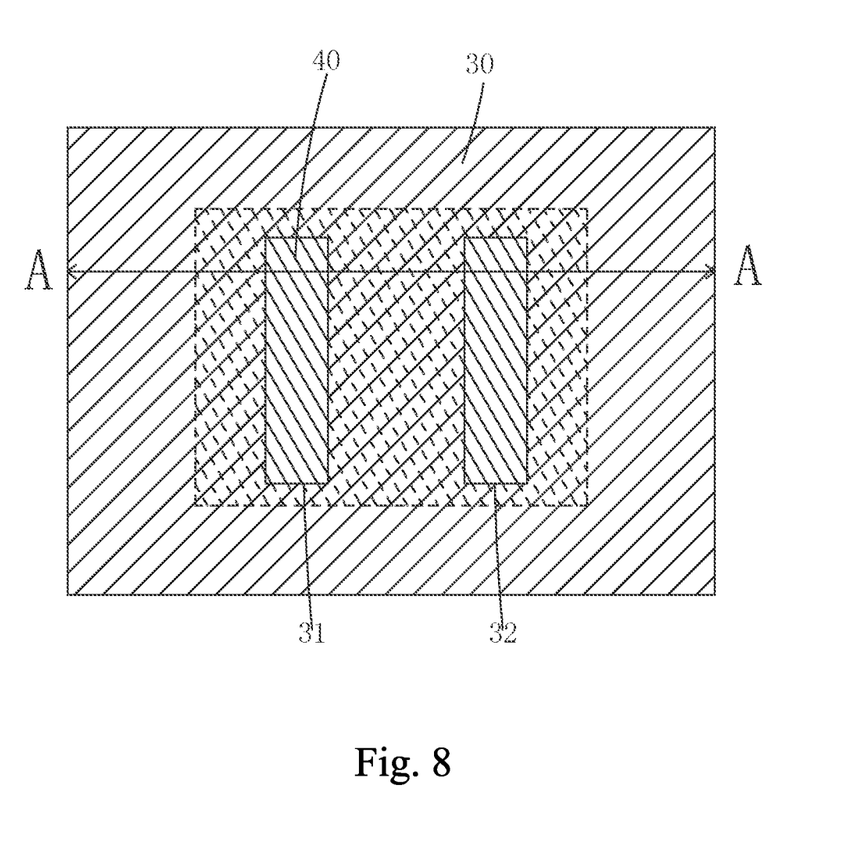

Step S4: as shown in FIGS. 6-7, providing a semiconductor solution, coating the semiconductor solution over the vertical U-shaped trench 25, the fluid characteristics of the semiconductor solution allowing the semiconductor to fill the vertical U-shaped trench 25, curing the semiconductor solution to form an active layer 40 filling the vertical U-shaped trench 25; removing the first photo-resist layer 90.

Specifically, the semiconductor solution provided in Step S4 is a carbon nanotube semiconductor solution, or a transparent oxide semiconductor solution, such as, a zinc oxide (ZnO) semiconductor solution, or an indium gallium zinc oxide (IGZO) semiconductor solution. That is, the material of the active layer is carbon nanotube semiconductor, zinc oxide semiconductor, or indium gallium zinc oxide semiconductor.

Step S5: providing a halftone grayscale mask 82, combining a halftone grayscale process and a lift-off process and using the second mask 82 through photo-dry-PVD-strip steps to form a sunk concave trench 35 between the first via 31 and the second via 32 on the second insulating layer 30, patternizing the second insulating layer 30 to form a source 51, a drain 52 and a gate 55 separated with intervals on the second insulating layer 30, the gate 55 being disposed on the second insulating layer 30 between the first via 51 and the second via 52 and inside the sunk concave trench 35, and the source 51 and the drain 55 being disposed on two sides of the gate 55 and respectively covering and contacting the active layer 40 inside the first via 31 and the second via 32.

Figure 9:
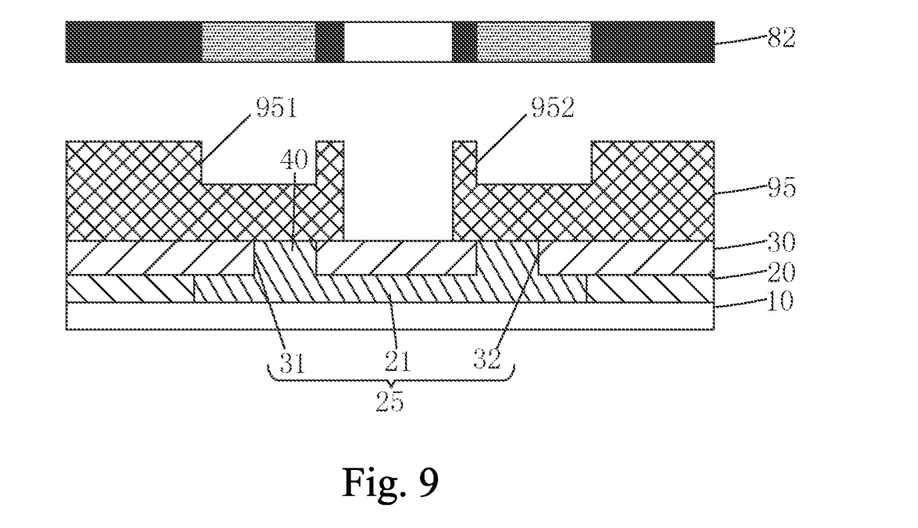
FIG. 9 is a schematic view showing Step S51 of the manufacturing method of top-gate TFT according to a preferred embodiment of the present invention.

Moreover, the specific steps in the Step S5 of combining a halftone grayscale process and a lift-off process to form the source 51, the drain 52 and the gate 55 comprise:

Step S51: as shown in FIG. 9, providing the second mask 82, coating a photo-resist on the second insulating layer 30, using the second mask 82 to perform exposure and lithography on the photo-resist to obtain a second photo-resist layer 95 of the second insulating layer 30 between the first via 31 and the second via 32, and a first concave trench 951 and a second concave trench 852 disposed on the second photo-resist layer 95 and correspondingly located above the first via 31 and the second via 32.

Specifically, the second mask 82 comprises a light-transmissive region, a semi-transmissive region, and a shielding region. During the light exposure, the light-transmissive region is located between the first via 31 and the second via 32 for forming the sunk concave trench 35, the semi-transmissive region covers the first via 31 and the second via 32 on both sides of the light-transmissive region for forming the source 51 and the drain 52, while the remaining part is the shielding region.

Figure 10:
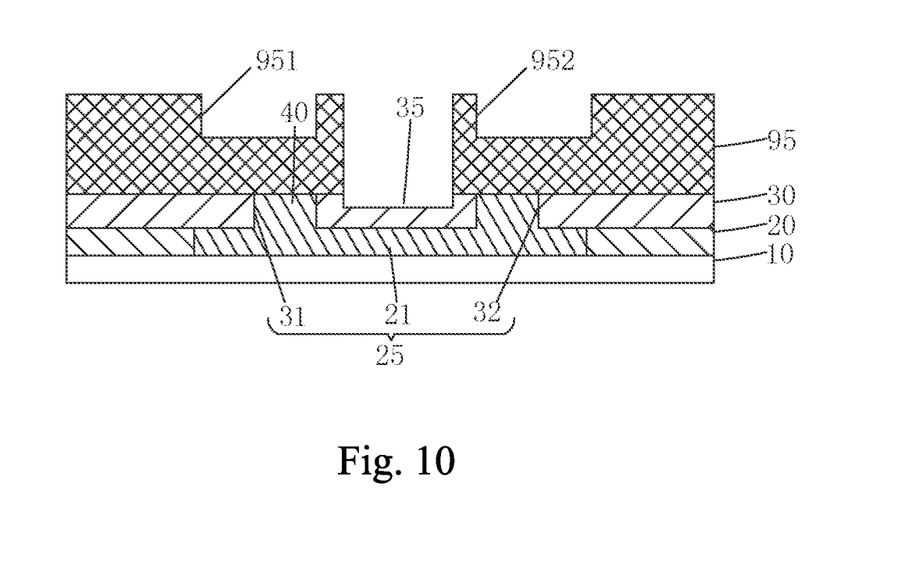
FIG. 10 is a schematic view showing Step S52 of the manufacturing method of top-gate TFT according to a preferred embodiment of the present invention.

Step S52: as shown in FIG. 10, using the second photo-resist layer 95 as shielding layer to etch the second insulating layer 30 to form the sunk concave trench 35 between the first via 31 and the second via 32 on the second insulating layer 30.

Figure 11:
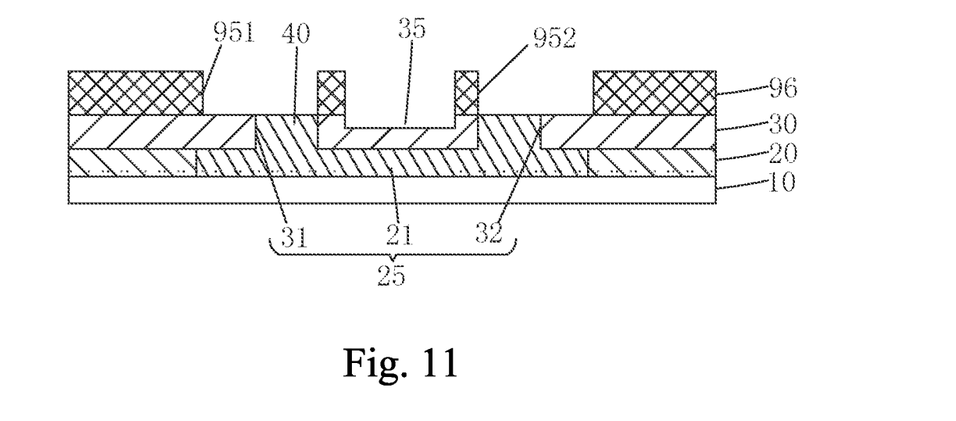
FIGS. 11-13 are schematic views showing Step S53 of the manufacturing method of top-gate TFT according to a preferred embodiment of the present invention.
Figure 12:
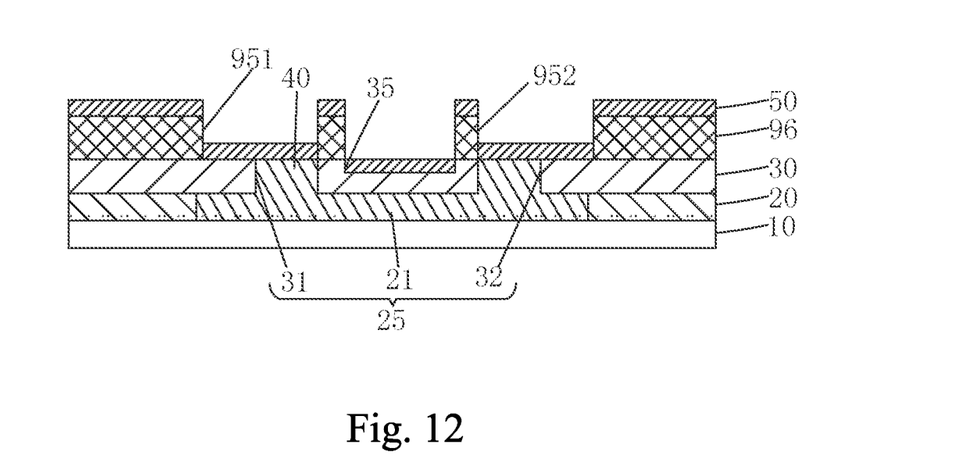
Figure 13:
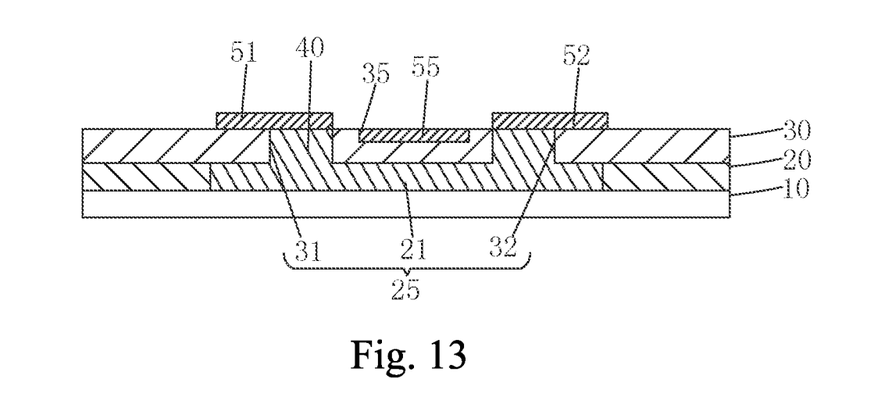

Step S53: as shown in FIGS. 11-13, performing oxygen ashing treatment on the second photo-resist layer 95 to thin the second photo-resist layer 95, the first concave trench 951 and the second concave trench 952 exposing the first via 31 and the second via 32 to obtain a third photo-resist layer 96 of the exposed first via 31, the second via 32, and the sunken concave trench 35, depositing by a PVD process a conductive metal layer 50 on the third photo-resist layer 96 and the second insulation layer 30, removing the third photo-resist layer 96 and the conductive metal layer 50 thereon to obtain the source 51, the drain 52, and the gate 55.

The manufacturing method of top-gate TFT of the present invention first forms a first insulating layer 20 and a second insulating layer 30 sequentially on a base substrate, and uses a first mask 81 to form a first via 31 and a second via 32 separated with interval on the second insulating layer 30, forms a through groove 21 on the first insulation layer 20 below the first via 31 and the second via 32, the through groove 21 connects the first and the second vias 31, 32, and forms a vertical U-shaped trench 25 with the first and second vias 31, 32, then fills the vertical U-shaped trench 25 to form an active layer 40, and finally uses a second mask 82 to form a source 51, a drain 52, and a gate 55 on the second insulating layer 30. As such, the top-gate TFT structure is simplified and the number of mask processes is reduced. With two mask processes to manufacture a top-gate TFT with vertical U-shaped trench, the invention saves the manufacturing cost.

Figure 14:
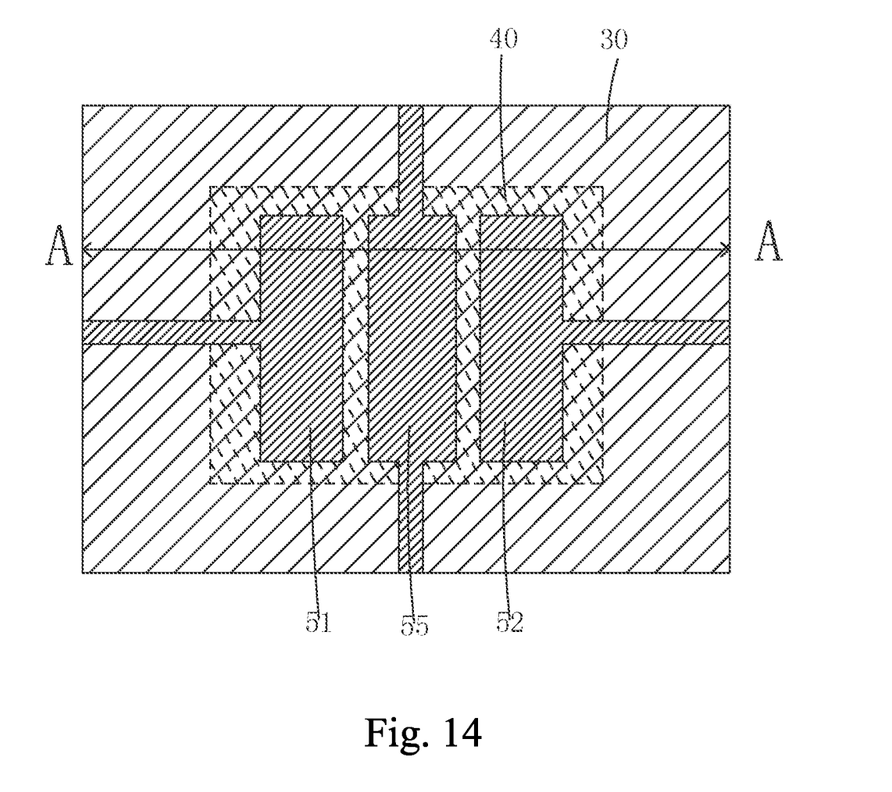

Refer to FIGS. 13-14. Based on the above manufacturing method, the present invention also provides a top-gate TFT, which comprises: a base substrate 10, a first insulating layer 20 disposed on the base substrate 10, a second insulating layer 30 disposed on the first insulating layer 20, a vertical U-shaped trench 25 disposed on the first insulating layer 20 and the second insulating layer 30, an active layer 40 filling the vertical U-shaped trench 25, and a source 51, a drain 52, and a gate 55 separated with intervals and disposed on the second insulating layer 30;

a first via 31 and a second via 32 disposed on the second insulating layer 30 and separated with interval, the first insulating layer 30 being disposed with a through groove 21 under the first via 31 and the second via 32, and contacting the first via 31 and the second via 32, the through groove 21, the first via 31, and the second via 32 forming the vertical U-shaped trench 25;

the gate 55 being disposed between the first via 31 and the second via 32 on the second insulating layer 30, and the source 51 and the drain 52 being disposed on two sides of the gate 55 and respectively covering and contacting the active layer 40 inside the first via 31 and the second via 32.

Specifically, a sunk concave trench 35 is disposed between the first via 31 and the second via 32 on the second insulating layer 30, and the gate 55 is disposed inside the sunk concave trench 35.

Specifically, the materials for the first insulating layer 20 and the second insulating layer 30 have different dielectric constants and film layer characteristics. Moreover, the material of the second insulating layer 30 can be silicon oxide ($SiO_x$) or silicon nitride ($SiN_x$), and the first via 31 and the second via 32 are formed by a dry etching process; the first insulating layer 20 can be formed with aluminum oxide ($Al_2O_3$), hafnium dioxide ($HfO_2$) or zirconium dioxide ($ZrO_2$), and the through groove 21 is formed by a wet etching process.

Specifically, the active layer 40 is formed by curing a semiconductor solution filling the vertical U-shaped trench 25. The semiconductor solution provided can be a carbon nanotube semiconductor solution, or a transparent oxide semiconductor solution, such as, a zinc oxide (ZnO) semiconductor solution, or an indium gallium zinc oxide (IGZO) semiconductor solution. That is, the material of the active layer 40 is carbon nanotube semiconductor, zinc oxide semiconductor, or indium gallium zinc oxide semiconductor.

The top-gate TFT of the present invention has a simple structure and can be manufactured with less mask processes to save manufacturing cost.

In summary, the manufacturing method of top-gate TFT of the present invention first forms a first insulating layer and a second insulating layer sequentially on a base substrate, and uses a first mask to form a first via and a second via separated with interval on the second insulating layer, forms a through groove on the first insulation layer below the first via and the second via, the through groove connects the first and the second vias, and forms a vertical U-shaped trench with the first and second vias, then fills the vertical U-shaped trench to form an active layer, and finally uses a second mask to form a source, a drain, and a gate on the second insulating layer. As such, the top-gate TFT structure is simplified and the number of mask processes is reduced. With two mask processes to manufacture a top-gate TFT with vertical U-shaped trench, the invention saves the manufacturing cost. The top-gate TFT of the present invention comprises a base substrate, a first insulating layer, a second insulating layer, an active layer, a source, a drain, and a gate; the second insulating layer is provided with a first via and a second via separated with interval, the first insulating layer is disposed with a through groove beneath the first via and the second via, the through groove connects the first via and the second via, and forms a vertical U-shaped trench with the first via and the second via; the active layer fills the vertical U-shaped trench, the gate is disposed on the second insulating layer between the first via and the second via, the source and the drain are disposed on two sides of the gate and respectively contact the active layer inside the first via and the second via. The structure is simple, and the number of mask process to manufacture is reduced to save manufacturing cost.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of top-gate thin film transistor (TFT), comprising the steps of:
   Step S1: providing a base substrate, a first insulating layer and a second insulating layer being deposited on the base substrate sequentially;
   Step S2: providing a first mask, using the first mask to form a first photo-resist layer on the second insulating layer, using the first photo-resist layer as a shielding layer to etch the second insulating layer to form a first via and a second via separated with interval on the second insulating layer;
   Step S3: etching the first insulating layer to form a through groove under the first via and the second via, and connecting the first via and the second via, the through groove, the first via, and the second via forming a vertical U-shaped trench;
   Step S4: providing a semiconductor solution, coating the semiconductor solution over the vertical U-shaped trench, curing the semiconductor solution to form an active layer filling the vertical U-shaped trench; removing the first photo-resist layer;
   Step S5: providing a second mask, using the second mask to patternize to form a source, a drain and a gate separated with intervals on the second insulating layer, the gate being disposed on the second insulating layer between the first via and the second via, and the source and the drain being disposed on two sides of the gate and respectively covering and contacting the active layer inside the first via and the second via.

2. The manufacturing method of top-gate TFT as claimed in claim 1, wherein the second mask provided in Step S5 is a halftone grayscale mask, and Step S5 further comprises forming a sunk concave trench between the first via and the second via on the second insulating layer, and the gate is disposed inside the sunk concave trench.

3. The manufacturing method of top-gate TFT as claimed in claim 2, wherein Step S5 specifically comprises:
   Step S51: providing the second mask, coating a photo-resist on the second insulating layer, using the second mask to perform exposure and lithography on the photo-resist to obtain a second photo-resist layer of the second insulating layer between the first via and the second via, and a first concave trench and a second concave trench disposed on the second photo-resist layer and correspondingly located above the first via and the second via;
   Step S52: using the second photo-resist layer as shielding layer to etch the second insulating layer to form the sunk concave trench between the first via and the second via on the second insulating layer;
   Step S53: performing oxygen ashing treatment on the second photo-resist layer to thin the second photo-resist layer, the first concave trench and the second concave trench exposing the first via and the second via to obtain a third photo-resist layer of the exposed first via, the second via, and the sunken concave trench, depositing a conductive metal layer on the third photo-resist layer and the second insulation layer, removing the third photo-resist layer and the conductive metal layer thereon to obtain the source, the drain, and the gate.

4. The manufacturing method of top-gate TFT as claimed in claim 1, wherein in Step S2, the second insulating layer is etched by a dry etching process using an etching gas;
   in Step S3, the first insulating layer is etched by a wet etching process using an etching liquid.

5. The manufacturing method of top-gate TFT as claimed in claim 4, wherein the material of the first insulating layer is aluminum oxide, hafnium dioxide or zirconium dioxide; the material of the second insulating layer is silicon oxide or silicon nitride.

6. The manufacturing method of top-gate TFT as claimed in claim 1, wherein the semiconductor solution provided in Step S4 is a carbon nanotube semiconductor solution, a zinc oxide semiconductor solution, or an indium gallium zinc oxide semiconductor solution.

7. A top-gate thin film transistor (TFT), comprising: a base substrate, a first insulating layer disposed on the base substrate, a second insulating layer disposed on the first insulating layer, a vertical U-shaped trench disposed on the first insulating layer and the second insulating layer, an active layer filling the vertical U-shaped trench, and a source, a drain, and a gate separated with intervals and disposed on the second insulating layer;
   a first via and a second via disposed on the second insulating layer and separated with interval, the first insulating layer being disposed with a through groove under the first via and the second via, and contacting the first via and the second via, the through groove, the first via, and the second via forming the vertical U-shaped trench;
   the gate being disposed between the first via and the second via on the second insulating layer, and the source and the drain being disposed on two sides of the gate and respectively covering and contacting the active layer inside the first via and the second via.

8. The top-gate TFT as claimed in claim 7, wherein a sunk concave trench is disposed between the first via and the second via on the second insulating layer, and the gate is disposed inside the sunk concave trench.

9. The top-gate TFT as claimed in claim 7, wherein the material of the first insulating layer is aluminum oxide, hafnium dioxide or zirconium dioxide;
   the material of the second insulating layer is silicon oxide or silicon nitride.

10. The top-gate TFT as claimed in claim 7, wherein the material of the active layer is carbon nanotube semiconductor, zinc oxide semiconductor, or indium gallium zinc oxide semiconductor.

11. A manufacturing method of top-gate thin film transistor (TFT), comprising the steps of:
    Step S1: providing a base substrate, a first insulating layer and a second insulating layer being deposited on the base substrate sequentially;

Step S2: providing a first mask, using the first mask to form a first photo-resist layer on the second insulating layer, using the first photo-resist layer as a shielding layer to etch the second insulating layer to form a first via and a second via separated with interval on the second insulating layer;

Step S3: etching the first insulating layer to form a through groove under the first via and the second via, and connecting the first via and the second via, the through groove, the first via, and the second via forming a vertical U-shaped trench;

Step S4: providing a semiconductor solution, coating the semiconductor solution over the vertical U-shaped trench, curing the semiconductor solution to form an active layer filling the vertical U-shaped trench; removing the first photo-resist layer;

Step S5: providing a second mask, using the second mask to patternize to form a source, a drain and a gate separated with intervals on the second insulating layer, the gate being disposed on the second insulating layer between the first via and the second via, and the source and the drain being disposed on two sides of the gate and respectively covering and contacting the active layer inside the first via and the second via;

wherein the second mask provided in Step S5 being a halftone grayscale mask, and Step S5 further comprising forming a sunk concave trench between the first via and the second via on the second insulating layer, and the gate being disposed inside the sunk concave trench;

wherein Step S5 specifically comprising:

Step S51: providing the second mask, coating a photo-resist on the second insulating layer, using the second mask to perform exposure and lithography on the photo-resist to obtain a second photo-resist layer of the second insulating layer between the first via and the second via, and a first concave trench and a second concave trench disposed on the second photo-resist layer and correspondingly located above the first via and the second via;

Step S52: using the second photo-resist layer as shielding layer to etch the second insulating layer to form the sunk concave trench between the first via and the second via on the second insulating layer;

Step S53: performing oxygen ashing treatment on the second photo-resist layer to thin the second photo-resist layer, the first concave trench and the second concave trench exposing the first via and the second via to obtain a third photo-resist layer of the exposed first via, the second via, and the sunken concave trench, depositing a conductive metal layer on the third photo-resist layer and the second insulation layer, removing the third photo-resist layer and the conductive metal layer thereon to obtain the source, the drain, and the gate;

wherein in Step S2, the second insulating layer being etched by a dry etching process using an etching gas;

in Step S3, the first insulating layer being etched by a wet etching process using an etching liquid;

wherein the material of the first insulating layer being aluminum oxide, hafnium dioxide or zirconium dioxide; the material of the second insulating layer being silicon oxide or silicon nitride;

wherein the semiconductor solution provided in Step S4 being a carbon nanotube semiconductor solution, a zinc oxide semiconductor solution, or an indium gallium zinc oxide semiconductor solution.

* * * * *